US006396094B1

(12) United States Patent
Mirkarimi et al.

(10) Patent No.: US 6,396,094 B1
(45) Date of Patent: May 28, 2002

(54) ORIENTED RHOMBOHEDRAL COMPOSITION OF $PBZR_{1-x}TI_xO_3$ THIN FILMS FOR LOW VOLTAGE OPERATION FERROELECTRIC RAM

(75) Inventors: Laura Wills Mirkarimi, Sunol; Jun Amano, Hillsborough, both of CA (US)

(73) Assignees: Agilent Technologies, Inc., Palo Alto, CA (US); Texas Instruments, Inc., Dallas, TX (US)

( * ) Notice: Subject to any disclaimer, the term of this patent is extended or adjusted under 35 U.S.C. 154(b) by 0 days.

(21) Appl. No.: 09/570,185

(22) Filed: May 12, 2000

(51) Int. Cl.[7] ............................................... H01L 29/76
(52) U.S. Cl. ...................... 257/295; 257/296; 257/300; 438/3
(58) Field of Search ................................ 257/295, 296, 257/300; 438/3

(56) References Cited

U.S. PATENT DOCUMENTS

| | | | |
|---|---|---|---|
| 5,767,541 A | | 6/1998 | Hanagasaki .................. 257/295 |
| 5,815,305 A | * | 9/1998 | Min et al. .................... 359/292 |
| 6,198,208 B1 | * | 3/2001 | Yano et al. ................... 310/358 |
| 6,254,708 B1 | * | 7/2001 | Cappabianca ............ 156/89.12 |
| 6,258,459 B1 | * | 7/2001 | Noguchi et al. ............. 428/446 |

FOREIGN PATENT DOCUMENTS

JP 58161924 A * 9/1983 ........... C01G/33/00

OTHER PUBLICATIONS

Du, et al., "Crystal Orientation Dependence of Piezoelectric Properties of Lead Zirconate Titanate Near the Morphotropic Phase Boundary", Applied Physics Letters, 72:2421–2423 (1998).

Du, et al., "Crystal Orientation Dependence of Piezoelectric Properties in Lead Zirconate Titanate: Theoretical Expectation for Thin Films", Jpn. J. Appl. Phys. 36:5580–5587 (1997).

Foster, et al., "Single–Crystal $Pb(Zr_xTi_{1-x})O_3$ Thin Films Prepared by Metal–Organic Chemical Vapor Deposition: Systematic Compositional Variation of Electronic and Optical Properties", J. Appl. Phys. 81:2349–2357 (1997).

* cited by examiner

*Primary Examiner*—Nathan Flynn
*Assistant Examiner*—Scott R. Wilson

(57) ABSTRACT

A means to minimize physical distortion and modifications in the electrical properties of ferroelectric films incorporated into semiconductor devices is proposed. By introducing crystallographic texture into these ferroelectric films, the piezoelectric coefficient of the material can be minimized, reducing the interaction between a voltage across and mechanical stress on the film. In addition to having low piezoelectric coefficients, rhombohedral lead zirconate titanate films oriented along (111) exhibit low coercive fields and high remnant polarization, increasing their usefulness in layered semiconductor devices.

18 Claims, 2 Drawing Sheets

ORIENTED RHOMBOHEDRAL COMPOSITION OF PBZR$_{1-x}$TI$_x$O$_3$ THIN FILMS FOR LOW VOLTAGE OPERATION FERROELECTRIC RAM

FIELD OF THE INVENTION

This invention relates to the production of ferroelectric memory, and, more particularly, to the production of ferroelectric memory incorporating oriented PbZr$_{1-x}$Ti$_x$O$_3$ thin films.

BACKGROUND OF THE INVENTION

Embedded memory applications bring together two different silicon technologies, logic and memory, presenting new challenges for device integration. To date, there have been many publications and patents on discrete ferroelectric (FE) capacitors for use in memory devices. However, commonly used FE materials, such as lead zirconate titanate (PZT), are piezoelectric, that is, their electrical properties vary in response to mechanical stress or physical distortion. In addition, they exhibit a physical distortion when an electric field is applied. This distortion may alter the charge storage properties of the material. Thus, as ferroelectric materials are embedded into devices containing four to five layers comprising various materials, the practitioner must be concerned with the electrical effects of stresses imposed on the ferroelectric layers. Memory applications require robust dielectric materials that are insensitive to fluctuations in stress resulting from deposition of subsequent layers. Dielectrics, including PZT and other ferroelectric materials, that are used in semiconductor memory must exhibit electrical properties independent of imposed external stresses. That is, the interaction between mechanical stress (or volume) and voltage must be reduced.

The majority of researchers studying ferroelectric thin films for memory applications employ tetragonal PZT materials as the storage medium because the remnant polarization is larger in the tetragonal phase than in other phases of PZT. In addition, these films are easier to produce than films incorporating other phases of PZT. However, tetragonal films require high drive voltages because of their relatively high coercive fields. In contrast, the current trend is to reduce the operating voltage of devices. The drive voltage can be reduced by decreasing film thickness, but these thin films are frequently not able to store charge reliably. Dielectric materials are required that can be utilized at lower voltages (i.e., lower coercivity materials) and that will exhibit electrical properties independent of imposed external stresses.

SUMMARY OF THE INVENTION

In one aspect, this invention is a multi-layer electrical device, for example, a capacitor or a transistor, including a dielectric layer and an electrically conductive layer in electrical communication with one another. The dielectric layer comprises a piezoelectric material for which the composition and orientation are chosen to minimize the effect of mechanical stresses imposed by the other layers of the device on the electrical properties of the piezoelectric material in the dielectric layer. In addition, the composition of the layer is optimized to maximize the number of available domains that are oriented along a projection of a polarization dipole of the piezoelectric material, increasing the number of domains in the layer that are available for charge storage. In a preferred embodiment, the piezoelectric material is a ferroelectric material having the composition PbZr$_{1-x}$Ti$_x$O$_3$ (PZT), where x is between 0.15 and 0.4. As a result, the ferroelectric material has a rhombohedral unit cell. The PZT may be deposited with a (111) orientation. The device may also include an underlying layer on which the PbZr$_{1-x}$Ti$_x$O$_3$ is deposited. The layer has an interatomic spacing, i.e., between 0.37 and 0.45 nm, compatible with that of the interatomic spacing within a plane with respect to which the deposited PbZr$_{1-x}$Ti$_x$O$_3$ is to be oriented. The layer may comprise platinum or iridium.

This invention is also directed to an oriented thin film comprising a dielectric material having an orientation wherein characteristics of the film such as composition and orientation are optimized to minimize the interaction between voltage across and mechanical stress on the dielectric material. In a preferred embodiment, the dielectric material comprises a ferroelectric material. Again, the material may have the composition PbZr$_{1-x}$Ti$_x$O$_3$, where x is between 0.15 and 0.4, resulting in a rhombohedral unit cell. The PZT may be deposited with a (111) orientation.

In another aspect, the invention is directed to an electrical device incorporating a dielectric layer that includes a piezoelectric material. The piezoelectric material comprises a ferroelectric material of the composition PbZr$_{1-x}$Ti$_x$O$_3$. Such a PZT material, where x is between 0.15 and 0.4, will have a rhombohedral unit cell. If the material is deposited with an (111) orientation, the electromechanical coefficient, $d_{33}$, will be minimized.

DETAILED DESCRIPTION

The instant invention concerns the production of an improved dielectric layer for semiconductor devices in which the piezoelectric properties of the dielectric material, i.e., PZT, are minimized. Rhombohedral PZT materials are attractive for ferroelectric memory applications for a variety of reasons. For example, because rhombohedral PZT has a coercive field about half that of the tetragonal phase, to achieve an operating voltage of 1.5 volts or less, a film comprising rhombohedral PZT can be twice the thickness of one incorporating tetragonal PZT.

Figure 1:
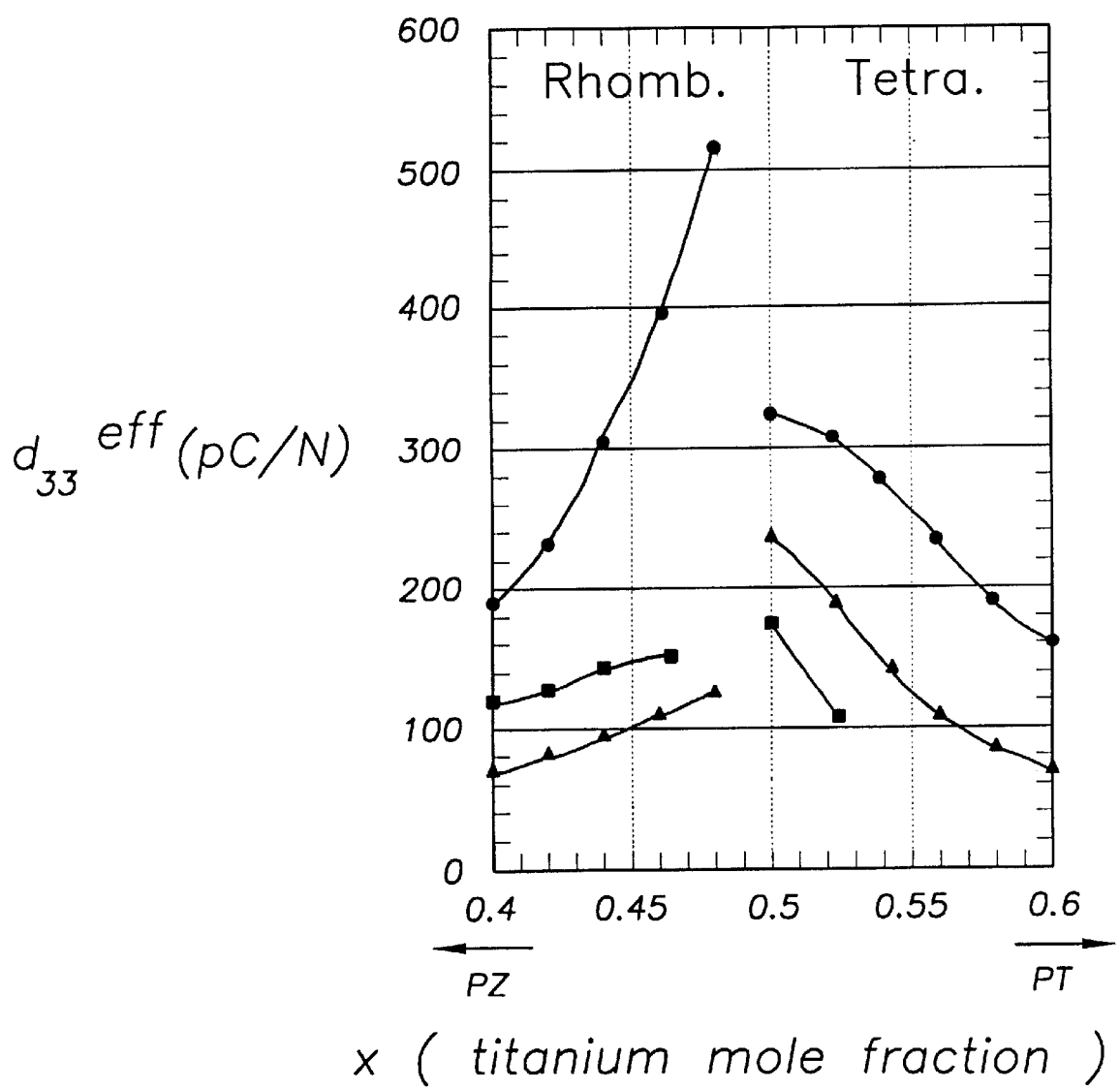
FIG. 1 is a graph showing the piezoelectric coefficient, $d_{33}$, as a function of crystallographic orientation and composition for rhombohedral and tetragonal PZT films.

Rhombohedral PZT also has a lower piezoelectric constant than tetragonal PZT (FIG. 1; Du, et al., *Appl. Phys. Lett.* 72:2421–2423, 1998). The minimum electromechanical coefficient, $d_{33}$, is significantly smaller along the pseudocubic [111] direction of the rhombohedral phase than along any direction in the tetragonal phase. For the rhombohedral phase material, the small dependence of the $d_{33}$ coefficient on composition provides the flexibility to choose the best composition for the ferroelectric material from an electrical performance standpoint. PbZr$_{1-x}$Ti$_x$O$_3$ thin films, where x is between 0.15 and 0.4, have a rhombohedral unit cell and are also far from the phase transition regions of rhombohedral to tetragonal (x~0.5) and rhombohedral to orthogonal at x~0.1.

Another problem that plagues ferroelectric materials such as tetragonal PZT is 90 degree domain formation. The 90 degree domains form in thin films to compensate for the thermal and lattice mistatch strain between the ferroelectric and the substrate, thereby reducing the system energy.

Tetragonal PZT exhibits a strong polarization dipole along the [001] and virtually no polarization along the [100], which forms a 90 degree angle with [001] in tetragonal systems. These [100] domains cannot be electrically switched, yielding no switched charge. However, the switched charge per capacitor will vary according to the domain pattern in the films. As the transistor size decreases, the ferroelectric capacitor must be reduced to fit within a smaller area. As a result, the switched charge per capacitor encompasses fewer and fewer averaged domains. In tetragonal PZT, the average switched charge will decrease as 90 degree domains, which contribute no switched charge, are formed. The rhombohedral phase material has a similar behavior to the tetragonal material and forms domains at angles slightly lower than 90 degrees. However, unlike the tetragonal material, the maximum dipole moment of the rhombohedral material lies along the 111 direction. Thus, in a 111 oriented rhombohedral PZT film that forms 90 degree domains, each domain will include a component, or projection, of [111], thereby reducing the variation in polarization charge between domains, yielding more consistent switched charge from one capacitor cell to another.

Rhombohedral compositions of (100) PZT display remnant polarizations of approximately 40 $\mu C/cm^2$ and coercive fields of 25–30 kV/cm. Because the maximum dipole lies along [111] and measurements of (100) oriented materials only indicate projections of the maximum (vector) value, (111) oriented rhombohedral materials may yield even higher remnant polarizations (Foster, et al., *J Appl. Phys.* 81:23492357, 1997). While the proportion of lead titanate should be kept between 15 and 40 percent, well away from the rhombohedral/tetragonal and rhombohedral/orthogonal phase transitions, routine manipulation of the composition within the rhombohedral range by one skilled in the art will enable optimization of electrical, magnetic, mechanical, and other properties.

Figure 2:
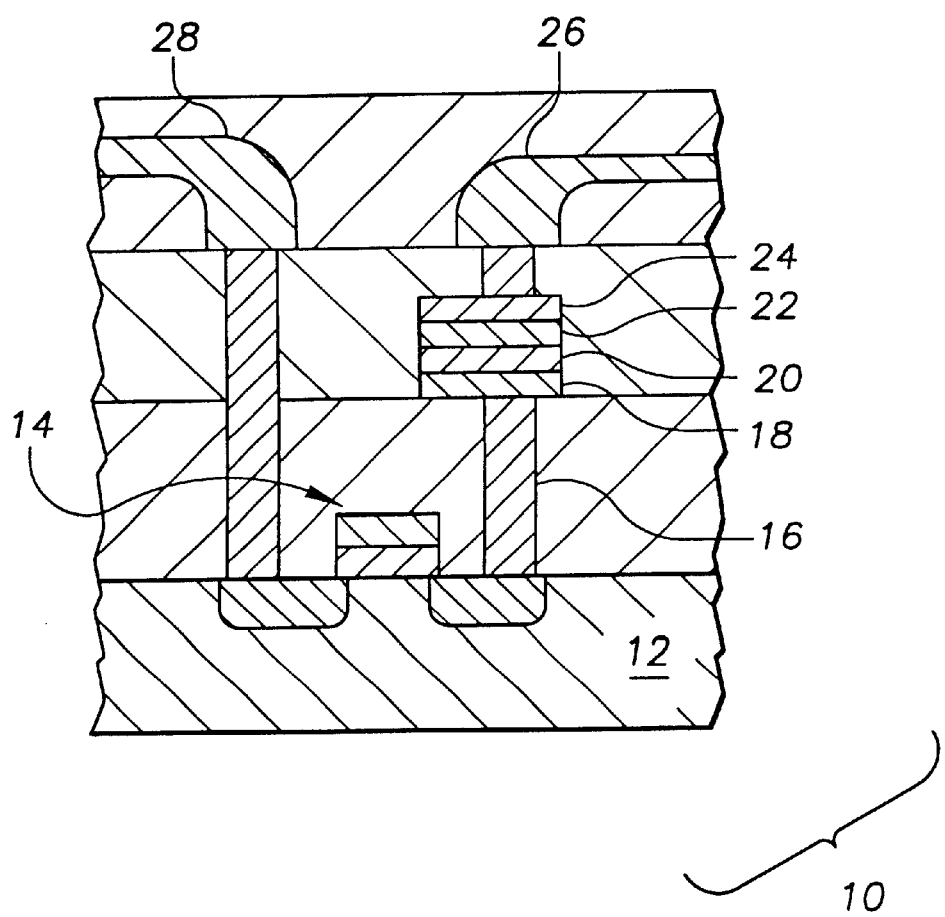
FIG. 2 is a cross-sectional view of a ferroelectric memory device incorporating a multi-layer device and an oriented thin film according to the invention.

In a preferred embodiment, rhombohedral PZT is incorporated as a dielectric layer into a ferroelectric memory device. FIG. 2 shows an exemplary one-transistor/one-capacitor ferroelectric memory device 10 comprising a silicon (or other semiconductor) substrate 12, transistor 14, plugs 16, a diffusion barrier 18, a bottom electrode 20, a dielectric layer 22, a top electrode 24, a bit line 26, and a metal line 28. Techniques for the manufacture of such memory devices are described in U.S. Pat. No. 5,767,541 to Hanagasaki, incorporated herein by reference. Rhombohedral PZT can also be incorporated into one-transistor type memories such as those described by U.S. Pat. No. 3,832,700 to Wu, the entire contents of which are incorporated herein by reference.

Rhombohedral PZT films can be deposited via metal-organic chemical vapor deposition (MOCVD), sputtering, or sol-gel. The phase is controlled in part by controlling the composition of the precursor materials. The grain size and orientation of a film deposited through any of these techniques may be engineered by any of several mechanisms. According to one mechanism, film texture is controlled by selecting a template having an interatomic spacing similar to the spacing of the desired lattice plane parallel to the substrate. Thus, if the lattice constants of the template and the growing film are similar, a particular growth direction can be promoted by obtaining a particular orientation in the substrate.

This principle may be applied to the deposition of PZT films by using either platinum or iridium as the template. Platinum and iridium are commonly used as electrodes for ferroelectric capacitors, and it is fortuitous that their lattice constants are particularly suited to this application. However, the substrate is not necessarily limited to Pt or Ir. Other applications for these oriented ferroelectric films may require different substrates. The only requirement is that the substrate have some plane (hkl) where the interatomic spacing is compatible with the interatomic spacing of the desired plane (h'k'l') along which the deposited material is being deposited. That is, the interatomic spacing of the substrate should facilitate film growth in the desired orientation. A general rule of thumb is that the two interatomic spacings should differ by less than about 10%. The lattice constants of iridium and platinum are approximately 0.394 nm and 0.392 nm, while rhombohedral PZT has a lattice constant of 0.411 nm. The lattice constants in the (111) direction for Ir and Pt are 0.653 nm and 0.680 nm; PZT (111) has a lattice constant of 0.71187 nm. For both orientations, the lattice mismatch between either Ir or Pt with the PZT is less than about 8%. Thus, PZT grown on (100) or (111) Pt or Ir would be expected to exhibit (100) or (111) texturing, respectively.

To achieve a single orientation in Pt and Ir, one may carefully choose the deposition parameters to encourage a particular orientation. For platinum, (100) is the fast growing plane. Intermediate growth temperatures (<400° C.) and relatively high deposition rates will encourage growth of (100) Pt. The (111) plane is the low energy surface; therefore, higher temperatures (>400° C.) that yield low growth rates will encourage this orientation. Another mechanism for encouraging (111) oriented Pt is to add a thin Ti seed layer beneath the Pt. It is well documented experimentally that Ti seed layers encourage a (111) texture.

While PZT layers for capacitors are frequently deposited on single crystal substrates, other surfaces on which the PZT layers are deposited, e.g., for transistors, are frequently polycrystalline. Thus, closely matched lattice constants are not sufficient to ensure development of the desired texture. Careful control of the deposition conditions and exploitation of other physical properties of the materials system may encourage a particular crystallographic orientation.

A third mechanism for controlling the texture is to adjust the deposition temperature of the PZT thin film in a similar manner to that described above for Pt and Ir. For example, the (111) orientation of the PZT can be promoted through lower growth rates at higher temperatures. In the rhombohedral phase, the ferroelectric dipole lies along the [111] direction. This may further encourage the (111) growth orientation.

It is expected that Ir will behave similarly to the Pt and that the above texturing practices will be effective with Ir as well as Pt.

Other embodiments of the invention will be apparent to those skilled in the art from a consideration of the specification or practice of the invention disclosed herein. It is intended that the specification and examples be considered as exemplary only, with the true scope of the invention being indicated by the following claims.

What is claimed is:

1. A multi-layer electrical device, comprising:
   a dielectric layer; and
   an electrically conductive layer in electrical communication with the dielectric layer, wherein:
      the dielectric layer comprises a piezoelectric material,
      the composition and orientation of the dielectric layer are chosen to minimize the effect of the mechanical stresses imposed by the other layers of the device on the electrical properties of the piezoelectric material in the dielectric layer, and a number of domains in the dielectric layer that are oriented along a projection of a polarization dipole of the piezoelectric material is maximized.

2. The device of claim 1, wherein the electrically conductive layer is adjacent to the dielectric layer.

3. The device of claim 1, wherein the dielectric layer comprises a ferroelectric material.

4. The device of claim 3, wherein the ferroelectric material has the composition $PbZr_{1-x}Ti_xO_3$.

5. The device of claim 4, wherein the $PbZr_{1-x}Ti_xO_3$ has a (111) orientation.

6. The device of claim 4, wherein the $PbZr_{1-x}Ti_xO_3$ has a rhombohedral unit cell.

7. The device of claim 4, wherein $0.15<x<0.4$.

8. The device of claim 4, further comprising an underlying layer on which the $PbZr_{1-x}Ti_xO_3$ is deposited having an interatomic spacing compatible with that of the interatomic spacing within a plane with respect to which the deposited $PbZr_{1-x}Ti_xO_3$ is to be oriented.

9. The device of claim 8, wherein the compatible spacing is between 0.37 and 0.45 nm.

10. The device of claim 8, wherein the underlying layer comprises platinum or iridium.

11. The electrical device of claim 1, wherein the device is a transistor or a capacitor.

12. An oriented thin film comprising a dielectric material, wherein
    characteristics of the film have been optimized to minimize the interaction between voltage across the dielectric material and mechanical stress on the dielectric material, and
    the optimized characteristics are selected from the group consisting of the composition of the dielectric material and the orientation of the film.

13. The oriented thin film of claim 12, wherein the dielectric material comprises a ferroelectric material.

14. The oriented thin film of claim 13, wherein the ferroelectric material has the composition $PbZr_{1-x}Ti_xO_3$.

15. The thin film of claim 14, wherein the ferroelectric material has a (111) orientation.

16. The thin film of claim 14, wherein the ferroelectric material has a rhombohedral unit cell.

17. The thin film of claim 14, wherein $0.15<x<0.4$.

18. The thin film of claim 14, wherein the ferroelectric material is deposited on an underlying layer having an interatomic spacing compatible with that of the interatomic spacing within a plane with respect to which the deposited $PbZr_{1-x}Ti_xO_3$ is to be oriented.

* * * * *